United States Patent
Udagawa (10) Patent No.: US 7,538,361 B2
(45) Date of Patent: May 26, 2009

(54) OHMIC ELECTRODE STRUCTURE, COMPOUND SEMICONDUCTOR LIGHT EMITTING DEVICE HAVING THE SAME, AND LED LAMP

(75) Inventor: Takashi Udagawa, Chichibu (JP)

(73) Assignee: Showa Denko K.K. (JP)

( * ) Notice: Subject to any disclaimer, the term of this patent is extended or adjusted under 35 U.S.C. 154(b) by 261 days.

(21) Appl. No.: 10/548,192

(22) PCT Filed: Mar. 22, 2004

(86) PCT No.: PCT/JP2004/003818

§ 371 (c)(1),
(2), (4) Date: Sep. 7, 2005

(87) PCT Pub. No.: WO2004/086522

PCT Pub. Date: Oct. 7, 2004

(65) Prior Publication Data

US 2006/0214182 A1    Sep. 28, 2006

Related U.S. Application Data

(60) Provisional application No. 60/458,950, filed on Apr. 1, 2003.

(30) Foreign Application Priority Data

Mar. 24, 2003  (JP) .............................. 2003-080003

(51) Int. Cl.
*H01L 27/15* (2006.01)
*H01L 29/26* (2006.01)
*H01L 31/12* (2006.01)
*H01L 33/00* (2006.01)

(52) U.S. Cl. ....................................... 257/103; 257/79
(58) Field of Classification Search ................... 257/77, 257/E33.063, E29.145, E29.144, 745; 438/255.38
See application file for complete search history.

(56) References Cited

U.S. PATENT DOCUMENTS 5,042,043 A *  8/1991  Hatano et al. .......... 372/45.012

(Continued)

FOREIGN PATENT DOCUMENTS

EP          0 729 191 A2       8/1996

(Continued)

OTHER PUBLICATIONS

"Electron Work Function of the Elements." Handbook of Chemistry and Physics. 87th Ed. 2006-2007. Section 12, p. 114.*

(Continued)

*Primary Examiner*—Jerome Jackson, Jr.
*Assistant Examiner*—Anthony Ho
(74) *Attorney, Agent, or Firm*—Sughrue Mion, PLLC (57) ABSTRACT

An Ohmic electrode structure comprising a p-conductivity-type boron phosphide-based semiconductor layer containing boron and phosphorus as constitutional elements and having a surface; and an electrode disposed on said surface of said semiconductor layer and having an Ohmic contact with said semiconductor layer, wherein at least a surface portion of said electrode which is in contact with said semiconductor layer is formed from a lanthanide element or a lanthanide element-containing alloy. A compound semiconductor light-emitting device comprising a light-emitting layer formed of a compound semiconductor may advantageously comprise the Ohmic electrode structure.

5 Claims, 3 Drawing Sheets

U.S. PATENT DOCUMENTS

| | | | | |
|---|---|---|---|---|
| 5,138,402 | A | * | 8/1992 | Tsukamoto et al. ......... 257/471 |
| 5,701,035 | A | | 12/1997 | Teraguchi |
| 5,838,019 | A | * | 11/1998 | Tsukamoto et al. .......... 257/10 |
| 5,898,192 | A | | 4/1999 | Gerner |
| 6,069,021 | A | | 5/2000 | Terashima et al. |
| 6,117,700 | A | * | 9/2000 | Orita et al. ................... 438/46 |
| 2002/0000558 | A1 | * | 1/2002 | Morimoto .................... 257/79 |
| 2004/0232404 | A1 | * | 11/2004 | Udagawa ..................... 257/11 |
| 2006/0043506 | A1 | * | 3/2006 | Udagawa ..................... 257/414 |

FOREIGN PATENT DOCUMENTS

| | | | |
|---|---|---|---|
| EP | 1168460 A2 | * | 2/2002 |
| JP | 2-288388 A | | 11/1990 |
| JP | 6-243968 A | | 9/1994 |
| JP | 2000-101100 A | | 4/2000 |
| JP | 2002-158282 A | | 5/2002 |
| JP | 2002-205322 A | | 7/2002 |

OTHER PUBLICATIONS

K. Shohno, et al, "Epitaxial Growth of BP Compounds on Si Substrates Using the $B_2H_6$-$PH_3$-$H_2$ System", Journal of Crystal Growth, vol. 24/25, 1974, pp. 193-196.

Y. Kumasiro, et al, "Preparation and Electrical Properties of Boron and Boron Phosphide Films Obtained by Gas Source Molecular Beam Deposition", Journal of Solid State Chemistry, vol. 133, 1997, pp. 269-272.

J.A. Duffy, "General Inorganic Chemistry" $5^{th}$ Edition, Apr. 15, 1971, p. 262-263.

Von Guenter Petzow, "Metal Etching Technique", AGNE, $1^{st}$ Edition, $1^{st}$ Printing, Sep. 10, 1977, p. 91.

J.A. Duffy, "General Inorganic Chemistry"; Apr. 15, 1971, $5^{th}$ edition, pp. 262-263.

von Guenter Petzow, "Metal Etching Technique" (translated by Gentaro Matsumura); AGNE, Sep. 10, 1977, $1^{st}$ edition, $1^{st}$ printing, p. 91.

* cited by examiner

US 7,538,361 B2

OHMIC ELECTRODE STRUCTURE, COMPOUND SEMICONDUCTOR LIGHT EMITTING DEVICE HAVING THE SAME, AND LED LAMP

CROSS REFERENCE TO RELATED APPLICATION

This application is an application filed under 35 U.S.C. §111(a) claiming benefit pursuant to 35 U.S.C. §119(e)(1) of the filing date of the Provisional Application No. 60/458,950 filed on Apr. 1, 2003, pursuant to 35 U.S.C. §111(b).

TECHNICAL FIELD

The present invention relates to a p-type Ohmic electrode structure which is to be provided on the surface of a p-conduction-type boron phosphide-based semiconductor layer so as to attain an Ohmic contact with the layer, and to a compound semiconductor device employing the p-type Ohmic electrode structure. More particularly, the present invention relates to a technique for fabricating a compound semiconductor light-emitting device.

BACKGROUND ART

Conventionally, there have been disclosed techniques for fabricating a boron phosphide-based semiconductor device such as a light-emitting diode (abbreviated as LED) from boron phosphide (chemical formula: BP), which is a type of Group III-V compound semiconductor, and a mixed crystal thereof (see, for example, U.S. Pat. No. 6,069,021). For example, a p-conduction-type boron monophosphide (chemical formula: BP) layer is employed to serve as a barrier layer constituting a light-emitting portion having a pn-doublehetero (DH) junction structure (see, for example, Japanese Laid-Open Patent Application (kokai) No. 2-288388). A boron phosphide-based semiconductor light-emitting diode is composed of, for example, a p-type cladding layer formed of a boron phosphide layer, and a p-type Ohmic electrode provided on the surface of the p-type cladding layer. In one conventional case, a p-type Ohmic electrode provided on a p-type boron phosphide layer is formed from aluminum (Al) (see, for example, K. Shohno et al., J. Crystal Growth, Vol. 24/25, 1974 (the Netherlands), p. 193).

Boron phosphide is known to provide either an n-conduction-type or a p-conduction-type low-resistance semiconductor layer, even when no impurity is intentionally added thereto (see, for example, K. Shohno et al., J. Crystal Growth, Vol. 24/25, 1974 (The Netherlands), p. 193). Thus, an Ohmic electrode can be formed on a conductive boron phosphide layer such as a cladding layer or a contact layer. In a conventional compound semiconductor light-emitting device having a magnesium (symbol of element: Mg)-doped p-type boron phosphide layer serving as a contact layer, an Ohmic contact electrode is formed from gold (symbol of element: Au)-zinc (symbol of element: Zn) (as disclosed in, for example, Japanese Laid-Open Patent Application (kokai) No. 2-288388).

However, when the aforementioned metallic species are employed, formation of an Ohmic electrode exhibiting excellent Ohmic contact properties with respect to p-type boron phosphide has not been successfully achieved. Therefore, input resistance upon passage of an electric current supplied for driving a light-emitting device (i.e., device operation current) disadvantageously increases, resulting in an LED exhibiting high forward voltage (Vf), which is problematic. Such high input resistance is also problematic for producing a laser diode (LD) having a low threshold voltage (Vth).

An object of the present invention is to provide a p-type Ohmic electrode structure, to provide excellent Ohmic contact properties, of a p-type Ohmic electrode on the surface of a p-type boron phosphide-based semiconductor layer containing boron (B) and phosphorus (P) as constitutional elements. The term "p-type Ohmic electrode" refers to a positive electrode which is provided on a p-type semiconductor layer. Another object of the present invention is to provide a compound semiconductor light-emitting device having a p-type Ohmic electrode having the electrode structure according to the present invention.

SUMMARY OF THE INVENTION

To attain the above objects, the present invention provides the following.

(1) An Ohmic electrode structure comprising:
a p-conductivity-type boron phosphide-based semiconductor layer containing boron and phosphorus as constitutional elements and having a surface; and
an electrode disposed on said surface of said semiconductor layer and having an Ohmic contact with said semiconductor layer, wherein at least a surface portion of said electrode which is in contact with said semiconductor layer is formed from a lanthanide element or a lanthanide element-containing alloy.

(2) The Ohmic electrode structure as described in (1) above, wherein said surface portion of said electrode in contact with said surface of said semiconductor layer is formed from an alloy composed of lanthanum and an element having a work function of 4.5 eV or less.

(3) The Ohmic electrode structure as described in (1) or (2) above, wherein said surface portion of said electrode in contact with said surface of said semiconductor layer is formed from an alloy composed of lanthanum and aluminum.

(4) The Ohmic electrode structure as described in (1) or (2) above, wherein said surface portion of said electrode in contact with said surface of said semiconductor layer is formed from an alloy composed of lanthanum and silicon.

(5) The Ohmic electrode structure as described in any one of (1) to (4) above, wherein said electrode comprises a bottom layer of said lanthanide element or lanthanide element-containing alloy which is in contact with said semiconductor layer, an intermediate layer of at least one of titanium, molybdenum and platinum on said bottom layer, and a top layer of gold or aluminum on said intermediate layer.

(6) A compound semiconductor device comprising said Ohmic electrode structure as recited in any one of (1) to (5) above, wherein said p-conductivity-type boron phosphide-based semiconductor layer is formed of p-type boron monophosphide which is undoped, where no impurity has been intentionally added, and has a band gap between 2.8 eV and 5.4 eV, inclusive, at room temperature.

(7) The compound semiconductor light-emitting device comprising said compound semiconductor device as recited in (6) above.

(8) A compound semiconductor light-emitting device comprising:
a crystalline substrate formed of an insulating or conductive crystal;
a light-emitting layer formed of a compound semiconductor formed on said crystalline substrate;
a p-conductivity-type boron phosphide-based semiconductor layer containing boron and phosphorus as constitutional elements and formed on said light-emitting layer, said p-conductivity-type boron phosphide-based semiconductor layer having a surface; and a p-conductivity-type Ohmic electrode formed in contact with and having an Ohmic contact with said surface of said p-conductivity-type boron phosphide-based semiconductor layer, wherein at least a surface portion of said p-conductivity-type Ohmic electrode which is in contact with said surface of said p-conductivity-type boron phosphide-based semiconductor layer is formed from a lanthanide element or a lanthanide element-containing alloy.

(9) The compound semiconductor light-emitting device as described in (8) above, wherein said p-conductivity-type boron phosphide-based semiconductor layer is formed of $B_\alpha Al_\beta Ga_\gamma In_{1-\alpha-\beta-\gamma} P_{1-\delta} As_\delta$ ($0 \leq \alpha 1$, $0 \leq \beta < 1$, $0 \leq \gamma < 1$, $0 < \alpha+\beta+\gamma \leq 1$, $0 \leq \delta < 1$) or $B_\alpha Al_\beta Ga_\gamma In_{1-\alpha-\beta-\gamma} P_{1-\delta} N_\delta$ ($0 < \alpha \leq 1$, $0 \leq \beta < 1$, $0 \leq \gamma < 1$, $0 < \alpha+\beta+\gamma \leq 1$, $0 \leq \delta < 1$).

(10) The compound semiconductor light-emitting device as described in (8) above, wherein said p-conductivity-type boron phosphide-based semiconductor layer is formed of boron monophosphide (BP), boron gallium indium phosphide (compositional formula: $B_\alpha Ga_\gamma In_{1-\alpha-\gamma} P$: $0 < \alpha \leq 1$, $0 \leq \gamma < 1$) or a mixed-crystal compound containing a plurality of Group V element in addition to boron and phosphorus.

(11) The compound semiconductor light-emitting device as described in (10) above, wherein said p-conductivity-type boron phosphide-based semiconductor layer is formed of boron nitride phosphide (compositional formula: $BP_{1-\delta} N_\delta$: $0 \leq \delta < 1$) or boron arsenide phosphide (compositional formula: $BP_{1-\delta} As_\delta$).

(12) The compound semiconductor light-emitting device as described in any one of (8) to (11) above, wherein said surface portion of said electrode in contact with said surface of said p-conductivity-type boron phosphide-based semiconductor layer is formed from an alloy composed of lanthanum and an element having a work function of 4.5 eV or less.

(13) The compound semiconductor light-emitting device as described in any one of (8) to (12) above, wherein said surface portion of said electrode in contact with said surface of said p-conductivity-type boron phosphide-based semiconductor layer is formed from an alloy composed of lanthanum and aluminum.

(14) The compound semiconductor light-emitting device as described in any one of (8) to (12) above, wherein said surface portion of said electrode in contact with said surface of said p-conductivity-type boron phosphide-based semiconductor layer is formed from an alloy composed of lanthanum and silicon.

(15) The compound semiconductor light-emitting device as described in any one of (8) to (14) above, wherein said compound semiconductor layer is formed of a Group III-V compound semiconductor.

(16) The compound semiconductor light-emitting device as described in any one of (8) to (15) above, wherein said compound semiconductor layer is formed of gallium indium nitride (compositional formula: $Ga_x In_{1-x} N$: $0 \leq x \leq 1$) or gallium nitride phosphide (compositional formula: $GaN_{1-y} P_y$: $0 \leq y \leq 1$).

(17) The compound semiconductor light-emitting device as described in any one of (8) to (16) above, wherein said surface portion of said electrode in contact with said surface of said p-conductivity-type boron phosphide-based semiconductor layer is formed from a lanthanide element or an alloy containing a lanthanide element, and has, as a planar shape, a pad electrode portion for establishing bonding and a net-like shape portion extending from said pad electrode portion.

(18) The compound semiconductor light-emitting device as described in any one of (7) to (17) above, wherein said p-conductivity-type boron phosphide-based semiconductor layer is formed of p-type boron monophosphide which is undoped, where no impurity has been intentionally added, and has a band gap between 2.8 eV and 5.4 eV, inclusive, at room temperature.

(19) An LED lamp employing said compound semiconductor device as recited in any one of (8) to (18) above.

MODE OF CARRYING OUT THE INVENTION

The present invention is directed to an electrode structure for providing excellent Ohmic contact properties with respect to a p-type boron phosphide-based semiconductor layer.

In the present invention, the term "boron phosphide-based semiconductor" refers to a compound semiconductor containing boron (symbol of element: B) and phosphorus (symbol of element: P) as constitutional elements. Specific examples include $B_\alpha Al_\beta Ga_\gamma In_{1-\alpha-\beta-\gamma} P_{1-\delta} As_\delta$ ($0 < \alpha \leq 1$, $0 \leq \beta < 1$, $0 \leq \gamma < 1$, $0 < \alpha+\beta+\gamma \leq 1$, $0 \leq \delta < 1$) and $B_\alpha Al_\beta Ga_\gamma In_{1-\alpha-\beta-\gamma} P_{1-\delta} N_\delta$ ($0 < \alpha \leq 1$, $0 \leq \beta < 1$, $0 \leq \gamma < 1$, $0 < \alpha+\beta+\gamma \leq 1$, $0 \leq \delta < 1$). Examples also include boron monophosphide (BP), boron gallium indium phosphide (compositional formula: $B_\alpha Ga_\gamma In_{1-\alpha-\gamma} P$: $0 < \alpha \leq 1$, $0 \leq \gamma < 1$) and a mixed-crystal compound containing a plurality of Group V element species such as boron nitride phosphide (compositional formula: $BP_{1-\delta} N_\delta$: $0 \leq \delta < 1$) or boron arsenide phosphide (compositional formula: $BP_{1-\delta} As_\delta$). The lower limit of the compositional proportion of phosphorus (P); for example, (1−δ) in the case of $BP_{1-\delta} N_\delta$, $BP_{1-\delta} As_\delta$, etc., is preferably 0.50 or higher, more preferably 0.75 or higher.

The p-type boron phosphide-based semiconductor layer on which a p-type Ohmic electrode is provided can be formed through the halogen method, the hydride method, or MOCVD (metal-organic chemical vapor deposition). Alternatively, the semiconductor layer can be vapor-phase grown through molecular beam epitaxy (see J. Solid State Chem., 133 (1997), p. 269-272). Specifically, a p-type boron monophosphide layer can be formed through MOCVD using triethylboran (molecular formula: $(C_2H_5)_3B$) and phosphine (molecular formula: $PH_3$) as sources. The p-type BP layer is preferably formed at 1,000° C. to 1,200° C., and the source feed ratio ($=PH_3/(C_2H_5)_3B$) during layer formation is preferably controlled to 10 to 50. The BP layer to which no impurity has been intentionally added; i.e., an undoped BP layer, effectively prevents deterioration of other component layers caused by diffusion of impurities. By rigorously controlling the formation speed as well as the formation temperature and the V/III ratio, a boron phosphide-based semiconductor layer having a wide band gap can be formed (see Japanese Patent Application No. 2002-158282).

A p-type boron phosphide-based semiconductor layer having a band gap at room temperature between 2.8 eV to 5.4 eV, inclusive, is particularly preferably used. More preferably, a p-type boron phosphide-based semiconductor layer having a band gap as wide as 2.8 eV to 3.2 eV can be employed as a barrier layer having a barrier effect; e.g., a p-type cladding layer, included in a compound semiconductor light-emitting device. Such a wide-band-gap p-type boron phosphide-based semiconductor layer suitably forms a window layer which permits transmission, to the outside of the light-emitting device, of visible light (blue, green, etc.) emitted from a light-emitting layer formed of gallium indium nitride (compositional formula: $Ga_xIn_{1-x}N$: $0 \leq x \leq 1$) or gallium nitride phosphide (compositional formula: $GaN_{1-y}P_y$: $0 \leq y \leq 1$). When the band gap is in excess of 5.4 eV, the barrier height with respect to the light-emitting layer increases, which is disadvantageous in production of a compound semiconductor light-emitting device having low forward voltage or threshold voltage. For example, the p-type cladding layer is suitably formed from a low-resistance boron phosphide layer having a carrier concentration of $1 \times 10^{19}$ $cm^{-3}$ or more and a resistivity of $5 \times 10^{-2}$ $\Omega \cdot cm$ or less, at room temperature. The thickness of the p-type boron phosphide layer constituting the p-type cladding layer is preferably controlled to 500 nm or more and 5,000 nm or less. In the structure of a p-type Ohmic electrode to be formed so as to attain contact with a p-type cladding layer, an excessively thin p-type cladding layer is unsuitable, because device operation current supplied via the Ohmic electrode cannot be uniformly diffused on the entire surface of the light-emitting layer.

No particular limitation is imposed on the compound semiconductor device which employs such a p-type boron phosphide-based semiconductor layer. However, a typical example is a boron phosphide-based semiconductor LED. Particularly, as mentioned above, the boron phosphide-based semiconductor layer is preferably used in combination with a light-emitting layer formed of gallium indium nitride (compositional formula: $Ga_xIn_{1-x}N$: $0 \leq x \leq 1$) or gallium nitride phosphide (compositional formula: $GaN_{1-y}P_y$: $0 \leq y \leq 1$). In addition, the boron phosphide-based semiconductor layer can be used in a compound semiconductor light-emitting device such as a laser diode (LD).

In the present invention, the bottom surface of the p-type Ohmic electrode to be in contact with the surface of the p-type boron phosphide-based semiconductor layer serving as a cladding layer, a contact layer for forming an electrode, or a similar layer is formed from a lanthanide element layer or from a layer of an alloy containing a lanthanide element.

The term "lanthanide element" refers to a group of elements including lanthanum (La, atomic number: 57) to lutetium (Lu, atomic number: 71) (see J. A. Duffy, "Inorganic Chemistry", Hirokawa Shoten, published on Apr. 15, 1971, 5th edition, p. 262). Elements such as cerium (Ce, atomic number: 58), praseodymium (Pr, atomic number: 59), neodymium (Nd, atomic number: 60), and holmium (Ho, atomic number: 67) are collectively referred to as "lanthanoids" (see the above "Inorganic Chemistry," p. 263). Particularly, in the present invention, the bottom portion of the p-type Ohmic electrode is preferably formed from lanthanum (La) or a lanthanum alloy, because, among lanthanoids, lanthanum and lanthanum alloys provide excellent Ohmic contact properties with respect to the p-type boron phosphide-based semiconductor layer. In addition, among lanthanoids, lanthanum and lanthanum alloys provide most excellent joining properties with respect to the boron phosphide-based semiconductor layer, whereby the bottom portion can be tightly joined to the layer.

Alloys formed of lanthanum and a substance having a work function of 4.5 eV or less are preferably used to form a bottom portion of the p-type Ohmic electrode which is to be in contact with the surface of the p-type boron phosphide-based semiconductor layer. When the alloy has a work function in excess of 4.5 eV, the barrier height with respect to the p-type boron phosphide-based semiconductor layer steeply increases, which is disadvantageous in production of the p-type Ohmic electrode. In addition to having a large work function, an alloy of lanthanum and a substance having a high melting point is advantageous for forming a p-type Ohmic electrode having excellent heat resistance. Therefore, alloys having high melting point are more preferable than lanthanum alloys with gallium (work function: 4.0 eV, melting point: 29.8° C.) or indium (work function: 3.8 eV, melting point: 156° C.), which have small work functions and low melting points. For example, the bottom portion exhibiting excellent Ohmic contact properties can be suitably formed from a lanthanum alloy with aluminum (work function: 4.3 eV, melting point: 660° C.) or a lanthanum alloy with silicon (work function: 4.0 eV, melting point: 1,414° C.). The aluminum (Al) or silicon (Si) content is suitably 1% by mass or higher and less than 50% by mass. Such lanthanum alloy film can be formed through use of means such as vacuum vapor deposition, electron beam vapor deposition, or high-frequency sputtering. The bottom portion having a desired planar shape such as circular or square can be formed by patterning the alloy film through a conventional photolithography technique. Examples of such alloys further include lanthanum telluride (compositional formula: $La_2Te_3$), which is a lanthanum alloy with tellurium (symbol of element: Te, work function: 4.3 eV, melting point: 450° C.), and a lanthanum nickel alloy (compositional formula: $LaNi_5$), which is a lanthanum alloy with nickel (symbol of element: Ni, work function: 4.5 eV, melting point: 1,453° C.).

Figure 1:
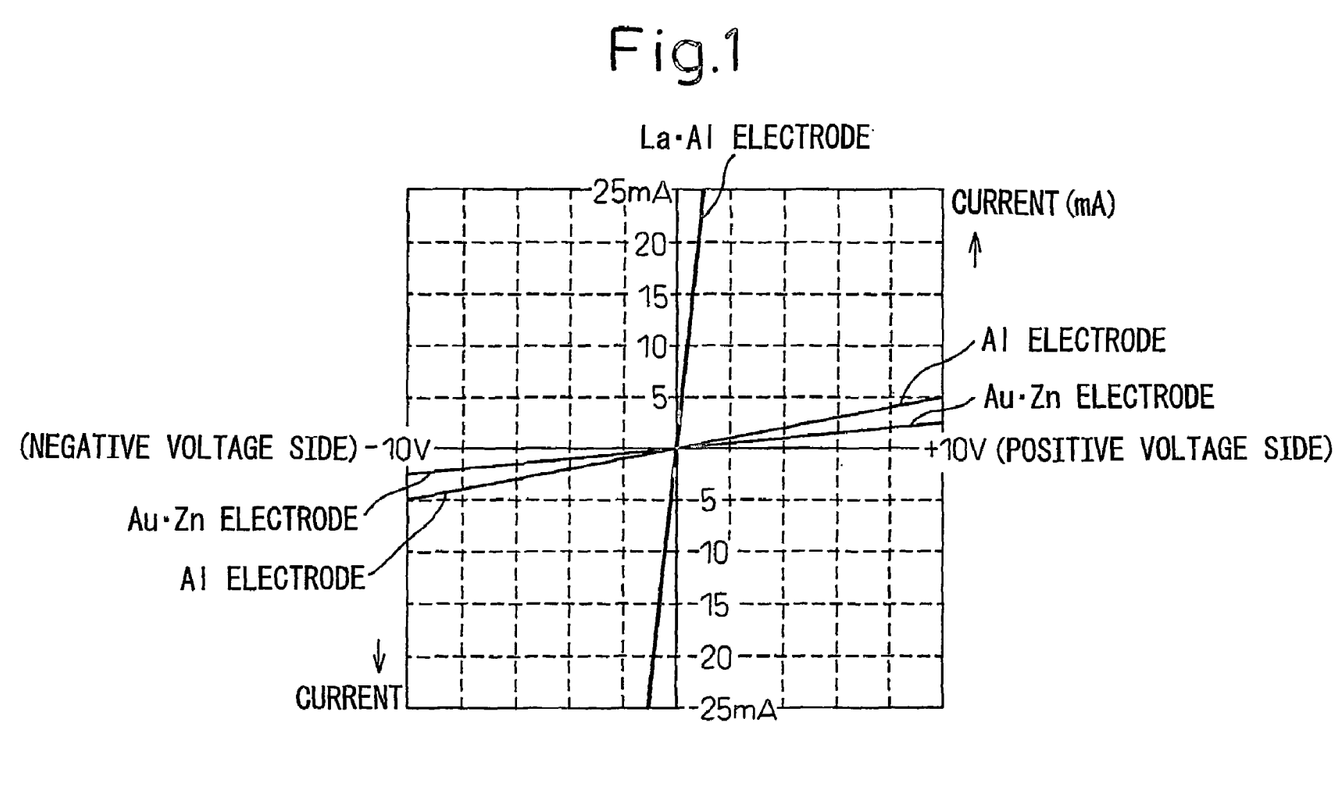
FIG. 1 is a graph showing current-voltage characteristics of the material of the present invention and conventional materials.

Characteristics of the p-type Ohmic electrode according to the present invention having a bottom portion formed of lanthanum or a lanthanum alloy can be investigated through, for example, a generally employed current-voltage (I-V) characteristic profile. For example, FIG. 1 shows an I-V characteristic profile of a p-type Ohmic electrode formed from a lanthanum-aluminum alloy (compositional formula: $LaAl_2$), as compared with those of a conventional electrode. The I-V characteristics were measured between p-type Ohmic electrodes arranged at an interval of 350 μm. In each measurement, a p-type boron phosphide layer having a constant electric resistance was used. Thus, a small resistance represents a small contact resistance. As shown in FIG. 1, under a given applied voltage, the $LaAl_2$ electrode according to the present invention can attain larger current flow, as compared with a conventional Ohmic electrode formed of aluminum (Al), a gold (Au)-zinc (Zn) alloy, or a gold (Au)-beryllium (Be) alloy. Thus, a p-type Ohmic electrode having smaller contact resistance can be produced.

In order to attain excellent contact between the Ohmic electrode and the p-type boron phosphide-based semiconductor layer, the p-type Ohmic electrode; particularly, the bottom portion thereof, is preferably formed from continuous film having no pores. Thus, the bottom portion is preferably formed from lanthanum-containing film having a thickness of 10 nm or more, more preferably 100 nm or more, most preferably 300 nm.

By stacking another metallic film on the upper surface of the bottom portion, an Ohmic electrode having a multilayer structure can be fabricated. For example, in a preferred mode, titanium (Ti) film and gold (Au) film are sequentially stacked on the bottom surface (circular planar shape) of an electrode member formed from lanthanum (La) (95 mass %)-aluminum (Al) (5 mass %) alloy film having a thickness of 120 nm, thereby forming a p-type Ohmic electrode of a triple-layer structure. When such a p-type Ohmic electrode having a stacked layer structure is fabricated, the uppermost layer is preferably formed from gold (Au) or aluminum (Al), so as to facilitate bonding. Furthermore, the intermediate layer included in a p-type Ohmic electrode of the triple-layer structure and sandwiched by the bottom portion and the uppermost layer can be formed from platinum (Pt) or a transition metal such as titanium or molybdenum (Mo).

Through employment of the p-type Ohmic electrode of the structure according to the present invention, a compound semiconductor light-emitting device having excellent electrical characteristics can be provided. For example, an LED exhibiting small forward voltage (Vf) can be provided. A visible-light-emitting, low-Vf LED can be formed by use of a stacked structure configuring sapphire substrate/n-type gallium nitride (GaN) cladding layer/n-type gallium indium nitride (GaInN) light-emitting layer/p-type boron phosphide (BP) cladding layer, wherein a p-type Ohmic electrode formed of lanthanum-aluminum alloy film is provided on the surface of the p-type BP cladding layer. In an LED having a chip size of 300 μm to 350 μm, the bottom portion of the p-type Ohmic electrode preferably has a diameter of, for example, 90 μm to 150 μm. When a $Ga_xIn_{1-x}N$ (0<x<1) layer of a multi-phase structure including a plurality of gallium indium nitride domains having indium compositional proportions (=1−x) that differ from one another is employed, a compound semiconductor light-emitting device attaining higher emission intensity can be effectively produced (Japanese Patent No. 3090057).

An effective means for fabricating a large-area LED having a side length of, for example, 500 μm or more is to dispose the p-type Ohmic electrode over a wide area of the surface of the p-type boron phosphide-based semiconductor layer. Such an Ohmic electrode is advantageous for producing an LED with high emission intensity and wide emission area, as the device operating current can be diffused over the wide area of the surface of the light-emitting layer. The Ohmic electrode is preferably formed in a shape such that the device operating current can be diffused uniformly. For example, a p-type Ohmic electrode formed of lanthanum-aluminum alloy is disposed on the surface of the p-type boron gallium phosphide mixed crystal layer provided on the light emitting layer such that the p-type Ohmic electrode assumes a lattice shape or a network shape so as to establish electric contact. Alternatively, a p-type Ohmic electrode is fabricated from the bottom portion of lanthanum-silicon alloy provided so as to attain contact with the p-type boron phosphide-based semiconductor layer and a portion extending radially or in a branching-like manner from the bottom portion to the periphery of the chip while electric conduction between the bottom portion and the electrode is maintained. Still alternatively, a p-type Ohmic electrode is fabricated from a plurality of concentric lanthanum-aluminum film members which are electrically connected with the pad electrode disposed on the center of the p-type boron phosphide-based semiconductor layer. In the pad electrode for wire bonding which relates to any of the above p-type Ohmic electrodes, when the bottom portion of the pad electrode is formed from a material having a high Ohmic contact resistance with respect to the p-type boron phosphide-based semiconductor layer, a flow of a device operating current to the bottom of the pad electrode from the directly underlying layer in a short circuit manner can be prevented, and advantageously, a device operational current can be diffused over a wide area of the light-emitting area opening to the outside so as to suitably permit transmission of emitted light.

In order to form a p-type Ohmic electrode having a desired planar shape, the entire surface of the p-type boron phosphide-based semiconductor layer is covered with, for example, lanthanum-aluminum alloy film through use of a conventional means such as vacuum vapor deposition or electron-beam vapor deposition. Subsequently, the alloy film is patterned into a desired shape through a conventional photolithography technique. The alloy film is preferably patterned into a shape such that an equipotential distribution can be realized in the p-type boron phosphide-based semiconductor layer. Then, an unnecessary portion of the alloy film is removed through use of means such as wet etching or plasma dry etching using a halogen gas (e.g., chlorine (molecular formula: $Cl_2$)). Wet-etching of lanthanoid alloy can be performed by use of an acid mixture liquid containing glacial acetic acid (e.g., glacial acetic acid-hydrogen peroxide mixture liquid) (see, von Guenter Petzow (translated by Gentaro Matsumura), "Metal Etching Technique," AGNE, Sep. 10, 1977, 1st edition, 1st printing, p. 91).

An electrode having a bottom portion which is in contact with the surface of the p-type boron phosphide-based semiconductor layer and which is formed of a lanthanide element or an alloy containing the element can provide a p-type Ohmic electrode exhibiting excellent Ohmic characteristics with respect to the p-type boron phosphide-based semiconductor layer.

A p-type Ohmic electrode having a bottom portion which is in contact with the surface of the p-type boron phosphide-based semiconductor layer and which is formed of a lanthanide element or an alloy containing the element can diffuse device operation current over a wide portion of the light-emitting area.

EXAMPLES

Example 1

The present invention will be described in detail by taking as an example a compound semiconductor LED fabricated by providing a p-type Ohmic electrode formed of a lanthanum-aluminum alloy ($LaAl_2$) on the surface of a p-type boron phosphide-base semiconductor layer.

Figure 2:
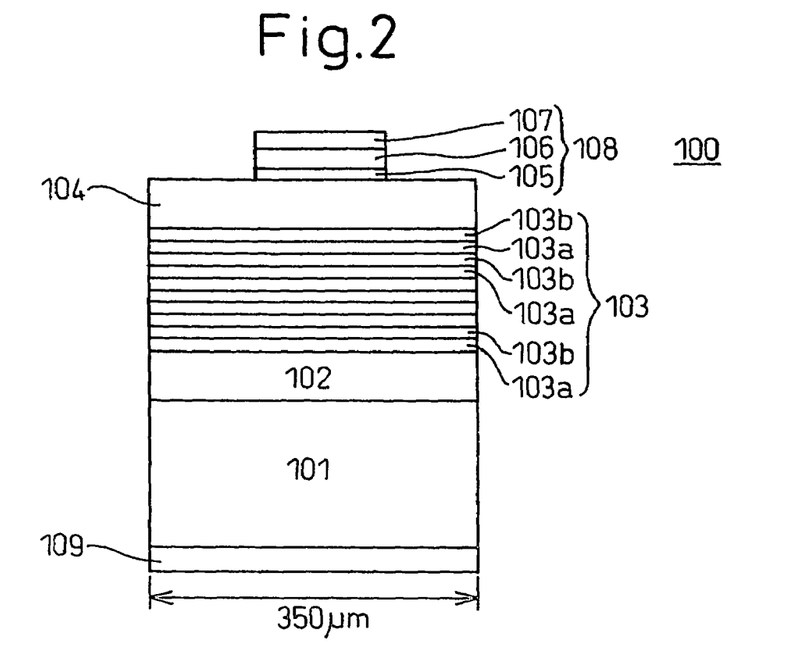
FIG. 2 is a schematic cross-sectional view of the LED mentioned in Example 1.

FIG. 2 schematically shows a cross-section of a stacked structure employed for fabricating an LED 100 having a double-hetero (DH) junction structure. The stacked structure was fabricated by sequentially depositing, on a phosphorus (P)-doped n-type (111)-silicon (Si) single-crystal substrate 101, a lower cladding layer 102 formed of undoped n-type boron phosphide (BP); a light-emitting layer 103 having a multi-layer quantum well structure including five units, each unit consisting of a n-type gallium indium nitride ($Ga_{0.90}In_{0.10}N$) well layer 103a and a gallium nitride (GaN) barrier layer 103b; and an upper cladding layer 104 formed of undoped p-type boron phosphide.

The undoped n-type and p-type boron phosphide layers 102 and 104 were formed through atmospheric pressure (near atmospheric pressure) metal-organic vapor phase epitaxy (MOVPE) means by use of triethylboran (molecular formula: $(C_2H_5)_3B$) as a boron (B) source and phosphine (molecular formula: $PH_3$) as a phosphorus source. The n-type boron phosphide layer 102 and the p-type boron phosphide layer 104 were formed at 925° C. and 1,025° C., respectively. The light-emitting layer 103 was formed through atmospheric pressure MOCVD means at 800° C. by use of trimethylgallium (molecular formula: $(CH_3)_3Ga$)/$NH_3$/$H_2$ reaction system. The aforementioned gallium indium nitride layer, serving as the well layer 103a, was formed of a multi-phase structure comprising a plurality of gallium indium nitride phases which were different in their indium compositional proportion. The average compositional proportion of In was found to be 0.10 (=10%). The thickness of the well layer 103a and that of the barrier layer 103b were controlled to 5 nm and 10 nm, respectively.

The carrier (hole) concentration and the thickness of the undoped p-type boron phosphide layer 104 serving as the upper cladding layer 104 were controlled to be $2\times10^{19}$ cm$^{-3}$ and 720 nm, respectively. The layer 104 was found to have a resistivity of $5\times10^{-2}$ Ω·cm at room temperature. As the p-type boron phosphide layer 104 had a band gap of 3.2 eV at room temperature, the layer 104 was employed as a p-type upper cladding layer also serving as a window layer through which light emitted from the light-emitting layer 103 is transmitted to the outside.

On the entire surface of the p-type boron phosphide layer 104 serving as the p-type upper cladding layer, a lanthanum-aluminum (LaAl$_2$) alloy film 105, a titanium (Ti) film 106, and a gold (Au) film 107 were deposited through a conventional vacuum vapor deposition method and a conventional electron beam vapor deposition method. Subsequently, through employment of a conventional photolithography technique, selective patterning was performed so as to leave the aforementioned triple-layer electrode with a bottom portion formed of the LaAl$_2$ alloy film 105, exclusively in an area for providing a pad electrode 108 for bonding. Then, the LaAl$_2$ alloy film and other film members present in the area except for the area to be serve as the pad electrode 108 were removed through etching by use of an acid-mixture liquid such as a glacial acetic acid-sulfuric acid-based liquid, whereby the surface of the p-type boron phosphide layer 104 was exposed. After removal of the photoresist, selective patterning was performed so as to provide lattice-pattern grooves for cutting the structure into chips. Thereafter, and exclusively within the thus-patterned area, the p-type boron phosphide layer 104 was selectively removed through the plasma dry etching method employing a halogen mixture gas containing chlorine.

On the entire backside surface of the silicon single-crystal substrate 101, an n-type Ohmic electrode (negative electrode) 109 was formed by depositing a gold (Au) film by means of a conventional vacuum vapor deposition method. The structure was cleaved along the aforementioned stripe-like cutting grooves having a line width of 50 μm, which had been provided in a direction parallel to the <110> crystalline direction that is normal to the (111)-crystal plane of the Si single-crystal substrate 101, thereby providing square LED chips having a side length of 350 μm.

In the present invention, the bottom portion of the p-type Ohmic electrode was formed from the lanthanum-aluminum (LaAl$_2$) alloy film 105 having excellent bonding performance with respect to the p-type boron phosphide layer serving as the upper cladding layer 104. Therefore, the p-type Ohmic electrode 108 which was not peeled off from the p-type boron phosphide layer 104 during wire bonding and which also served as the pad electrode could be formed.

Emission characteristics of each LED chip 100 was confirmed upon passage of a device operation current of 20 mA in the forward direction between the p-type Ohmic electrode 108 and the n-type Ohmic electrode 109. The LED 100 emitted a blue light having an emission center wavelength of 440 nm, with a half peak full width observed in the emission spectrum of 210 meV. The luminous intensity of the LED chip, before being resin-molded and as determined through a conventional photometric sphere, was 11 mcd. As the bottom portion of the p-type Ohmic electrode 105 was formed from LaAl$_2$ alloy film having a small contact resistance with respect to the p-type boron phosphide layer, the forward voltage (Vf) at a forward current of 20 mA was found to be as low as 3.1 V and the reverse voltage at a reverse current of 10 μA was found to be as high as 9.5 V. Furthermore, an emission induced by a device operation current was provided from a virtually entire portion of the emission area except for the projectional area of the pad electrode, because the upper cladding layer was formed from a low-resistance undoped p-type boron phosphide layer having a high carrier concentration, and a p-type Ohmic electrode including a low-contact-resistance lanthanum-aluminum alloy film was provided so as to attain an Ohmic contact with the surface the p-type boron phosphide.

Example 2

Figure 3:
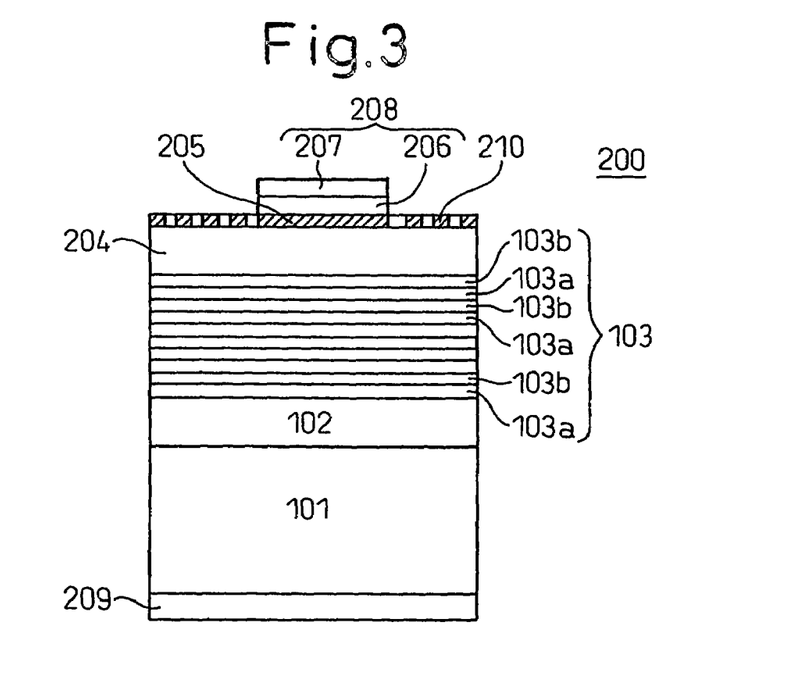
FIG. 3 is a schematic cross-sectional view of the LED mentioned in Example 2.
Figure 4:
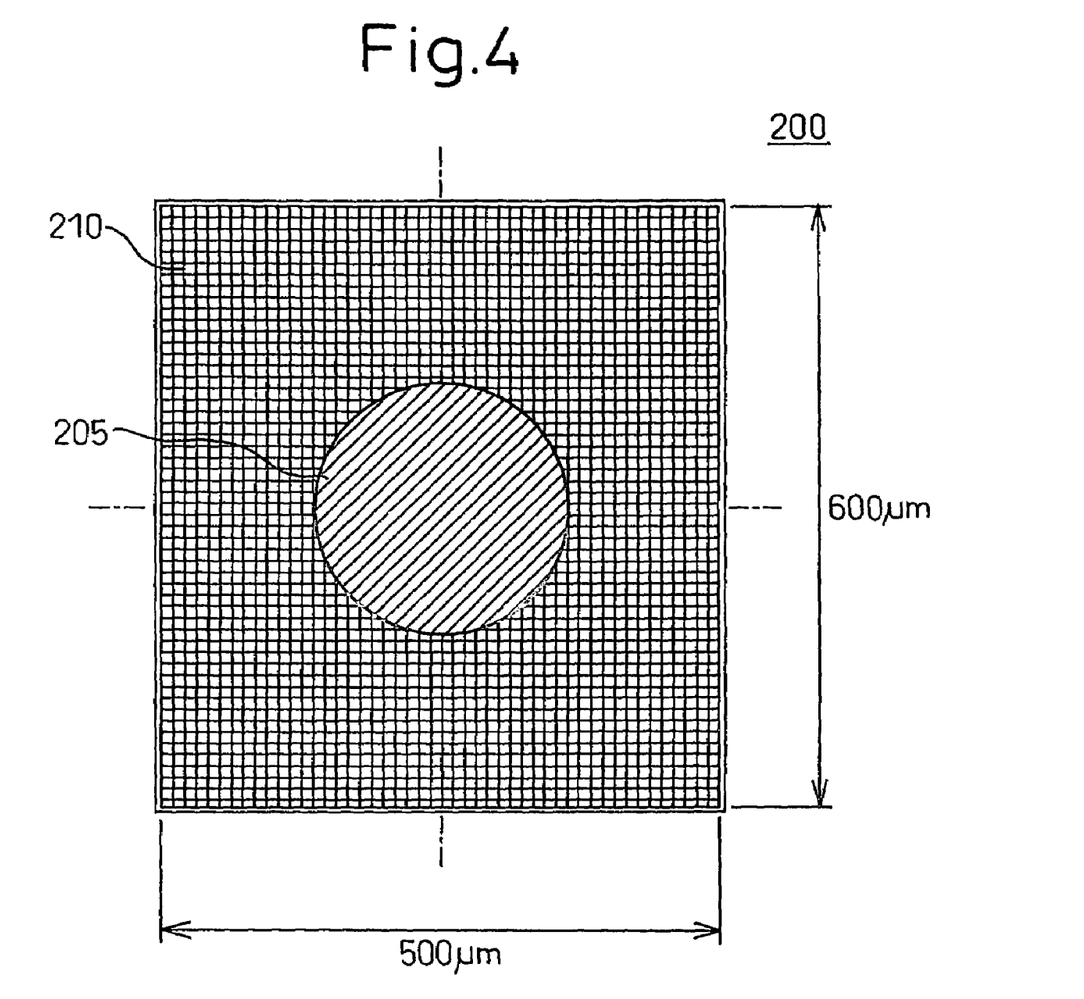
FIG. 4 is a schematic plan view of the LED mentioned in Example 2.

The present invention will be described in detail by taking as an example a compound semiconductor LED fabricated by providing a p-type Ohmic electrode formed of a lanthanum-silicon alloy on the surface of a p-type boron gallium phosphide mixed crystal layer. The essential structure of the compound semiconductor light-emitting device of Example 2 is the same as that of the LED of Example 1, and the same members are represented by the same reference numerals as employed in Example 1. FIG. 3 is a cross-section of and FIG. 4 is a plan view of the device of Example 2.

On the light-emitting layer 103 mentioned in the aforementioned Example 1, an undoped p-type boron gallium phosphide mixed crystal (B$_{0.98}$Ga$_{0.02}$P) layer 204 was deposited. The B$_{0.98}$Ga$_{0.02}$P layer 204 was formed through reduced-pressure MOCVD means at 850° C. using a (C$_2$H$_5$)$_3$B/(CH$_3$)$_3$Ga/PH$_3$ system. The thickness of the layer was controlled to 340 nm. The carrier concentration and the resistivity of the B$_{0.98}$Ga$_{0.02}$P layer 204 were found to be $8\times10^{18}$ cm$^{-3}$ and $8\times10^{-2}$ Ω·cm at room temperature, respectively.

Subsequently, on the entire surface of the p-type B$_{0.98}$Ga$_{0.02}$P layer 204, a lanthanum-silicon (La—Si) alloy film 205 was deposited through a conventional vacuum vapor deposition method. The thickness of the La—Si alloy film 205 was controlled to be 540 nm. Subsequently, patterning was performed through employment of a conventional photolithography technique and plasma etching technique. Then, an unnecessary portion of the alloy film was removed through the plasma dry etching method, whereby, as shown in FIG. 3, the La—Si alloy film was patterned so as to provide a circle 205 (diameter: 150 μm) at the center of the LED chip 200 and provide a network-like portion 210 around the circle so as to attain contact with the surface of the p-type B$_{0.98}$Ga$_{0.02}$P layer. On the thus-provided circle portion, an intermediate layer 206 and a gold film 207 were formed, thereby forming a pad electrode 208.

On the entire back surface of the silicon single-crystal substrate 101, a gold (Au) (99 mass %)-antimony (Sb) (1 mass %) alloy film 209 was deposited through a common vacuum vapor deposition method.

Subsequently, the thus-patterned La—Si alloy film and the deposited gold film were sintered at 450° C. for 10 minutes under a hydrogen flow while the films remained in contact with the stacked structure, thereby enhancing the Ohmic contact performance. Thus, the p-type Ohmic electrode 205 formed of La—Si was provided on the surface of the p-type B$_{0.98}$Ga$_{0.02}$P layer 204, and the Au Ohmic electrode 209 was formed on the backside of the silicon single-crystal substrate 101. The Au film serving as the n-type Ohmic electrode 209 was controlled to 2 μm.

Subsequently, cutting was performed along the cutting lines which had been provided during etching of the aforementioned La—Si alloy film, to produce individual LED chips. The cutting grooves were provided in parallel to the crystalline orientations of the Si single-crystal substrate 101 of [1.−1.0] and [−1.−1.0], whereby individual LED chips 200 in the form of rectangular having side lengths of 500 μm and 600 μm were produced. When a forward current of 20 mA was caused to flow between the p-type and the n-type Ohmic electrodes 205 and 209 of each large-scale LED chip 200, the emitted light had an emission center wavelength of 440 nm. A near-field light emission pattern indicated that the emission intensity was uniform on the entire portion of the emission area except for the area of the pad electrode disposed at the center of the chip 200. Such emission was attained because the p-type Ohmic electrode was provided in such a manner that the device operation current can be uniformly diffused in a wide area of the p-type $B_{0.98}Ga_{0.02}P$ layer. The forward voltage at a forward current of 20 mA was found to be 3.4 V and the reverse voltage at a reverse current of 10 μA was found to be 8.3 V.

INDUSTRIAL APPLICABILITY

According to the present invention, a p-type Ohmic electrode which is provided so as to attain an Ohmic contact with the surface of a p-type boron phosphide-based semiconductor layer is formed from a lanthanide element or an alloy film containing a lanthanide element, and an electrode having a low contact resistance can be formed, resulting in effective utilization of a device operation current supplied for light emission. Therefore, a compound semiconductor light-emitting device attaining a high emission intensity can be produced. Furthermore, by connecting a lead wire to the compound semiconductor light-emitting device according to the present invention, and molding the assembly with a resin, a high-luminance LED lamp can be produced.

The invention claimed is:

1. An ohmic electrode structure comprising:
   a p-conductive-type boron phosphide-based semiconductor layer containing boron and phosphorus as constitutional elements and having a surface; and
   an ohmic electrode disposed on and having an ohmic contact with said surface of said p-conductive-type boron phosphide-based semiconductor layer;
   wherein at least a bottom surface portion of said ohmic electrode which is in contact with said surface of said p-conductive-type boron phosphide-based semiconductor layer is formed from an alloy composed of lanthanum and silicon containing 1% to less than 50% by mass of silicon.

2. A compound semiconductor light-emitting element comprising
   a crystalline substrate formed of an insulating or conductive crystal;
   a light-emitting layer comprising a compound semiconductor layer formed on said crystalline substrate;
   a p-conductive-type boron phosphide-based semiconductor layer comprising boron and phosphorus as constitutional elements formed on said light-emitting layer and having a surface; and
   a p-conductive-type ohmic electrode in contact with said p-conductive-type boron phosphide-based semiconductor layer;
   wherein at least a bottom surface portion of said p-conductive-type ohmic electrode which is in contact with said surface of said p-conductive-type boron phosphide-based semiconductor layer is formed from an alloy composed of lanthanum and silicon.

3. The compound semiconductor light-emitting element as claimed in claim 2, wherein the p-conductive-type ohmic electrode is in ohmic contact with the p-conductive-type boron phosphide-based semiconductor layer.

4. A compound semiconductor light-emitting element comprising
   a crystalline substrate formed of an insulating or conductive crystal;
   a light-emitting layer comprising a compound semiconductor layer formed on said crystalline substrate;
   a p-conductive-type boron phosphide-based semiconductor layer, formed on said light-emitting layer, which semiconductor layer is undoped, and has a band gap between 2.8 eV and 5.4 eV, inclusive, at room temperature, said p-conductive-type boron phosphide-based semiconductor layer having a surface; and
   a p-conductive-type ohmic electrode in contact with said surface of said p-conductive-type boron phosphide-based semiconductor layer;
   wherein at least a bottom surface portion of said p-conductive-type ohmic electrode which is in contact with a surface of said p-conductive-type boron phosphide-based semiconductor layer is formed from a lanthanide element or a lanthanide element-containing alloy.

5. The compound semiconductor light-emitting element as claimed in claim 4, wherein the p-conductive-type ohmic electrode is in ohmic contact with the surface of the p-conductive-type boron phosphide-based semiconductor layer.

* * * * *